(12) United States Patent
Sager et al.

(10) Patent No.: US 7,291,782 B2
(45) Date of Patent: *Nov. 6, 2007

(54) OPTOELECTRONIC DEVICE AND FABRICATION METHOD

(75) Inventors: Brian M. Sager, Menlo Park, CA (US); Martin R. Roscheisen, San Francisco, CA (US); Klaus Petritsch, Foster City, CA (US); Greg Smestad, Pacific Grove, CA (US); Jacqueline Fidanza, San Francisco, CA (US); Gregory A. Miller, Mountain View, CA (US); Dong Yu, Fremont, CA (US)

(73) Assignee: Nanosolar, Inc., Palo Alto, CA (US)

( * ) Notice: Subject to any disclaimer, the term of this patent is extended or adjusted under 35 U.S.C. 154(b) by 461 days.

This patent is subject to a terminal disclaimer.

(21) Appl. No.: 10/290,119

(22) Filed: Nov. 5, 2002

(65) Prior Publication Data

US 2004/0084080 A1    May 6, 2004
US 2007/0181177 A9    Aug. 9, 2007

Related U.S. Application Data

(60) Provisional application No. 60/390,904, filed on Jun. 22, 2002.

(51) Int. Cl.
*H01L 31/0352* (2006.01)

(52) U.S. Cl. ............ 136/250; 136/244; 136/255; 257/40; 257/465; 257/466; 257/464

(58) Field of Classification Search ............ 136/263, 136/255, 244, 251, 256; 257/40, 465, 466, 257/464, 461, 43, 79, 103, 99, 94, 431
See application file for complete search history.

(56) References Cited

U.S. PATENT DOCUMENTS

| | | | |
|---|---|---|---|
| 4,499,658 A * | 2/1985 | Lewis | 438/64 |
| 5,482,570 A | 1/1996 | Saurer et al. | 136/255 |
| 5,525,440 A | 6/1996 | Kay et al. | 429/111 |
| 5,571,612 A | 11/1996 | Motohiro et al. | 428/323 |
| 5,674,325 A | 10/1997 | Albright et al. | 126/250 |
| 5,986,206 A | 11/1999 | Kambe et al. | 136/263 |
| 5,990,415 A * | 11/1999 | Green et al. | 136/255 |
| 6,075,203 A | 6/2000 | Wang et al. | 136/256 |
| 6,270,846 B1 | 8/2001 | Brinker et al. | 427/385.5 |
| 6,278,056 B1 | 8/2001 | Sugihara et al. | 136/263 |
| 6,291,763 B1 * | 9/2001 | Nakamura | 136/256 |
| 6,340,789 B1 | 1/2002 | Petritsch et al. | 136/263 |
| 6,852,920 B2 * | 2/2005 | Sager et al. | 136/263 |
| 6,946,597 B2 * | 9/2005 | Sager et al. | 136/263 |
| 2002/0017656 A1 | 2/2002 | Graetzel et al. | |
| 2002/0134426 A1 | 9/2002 | Chiba et al. | |
| 2002/0192441 A1 * | 12/2002 | Kalkan et al. | 428/209 |
| 2003/0226498 A1 | 12/2003 | Alivisatos et al. | 117/84 |
| 2004/0084080 A1 | 5/2004 | Sager et al. | 136/263 |
| 2004/0109666 A1 * | 6/2004 | Kim, II | 385/147 |
| 2004/0118448 A1 | 6/2004 | Scher et al. | 136/252 |
| 2004/0146560 A1 | 7/2004 | Whiteford et al. | 424/484 |
| 2004/0178390 A1 | 9/2004 | Whiteford et al. | 252/500 |
| 2005/0098204 A1 * | 5/2005 | Roscheisen et al. | 136/263 |
| 2005/0098205 A1 * | 5/2005 | Roscheisen et al. | 136/263 |
| 2005/0183767 A1 * | 8/2005 | Yu et al. | 136/263 |
| 2005/0183768 A1 * | 8/2005 | Roscheisen et al. | 136/263 |
| 2005/0206306 A1 * | 9/2005 | Perlo et al. | 313/504 |

FOREIGN PATENT DOCUMENTS

| | | | |
|---|---|---|---|
| DE | 2741954 | | 3/1979 |
| DE | 2741954 A | * | 3/1979 |
| EP | 1028475 A1 | * | 8/2000 |
| EP | 1087446 A2 | * | 3/2001 |
| WO | WO 02/84708 | | 10/2002 |

OTHER PUBLICATIONS

K. Tennakone et al, "A dye-Sensitized Nano-Porous Solid-State Photovoltaic Cell," Semiconductor Science and Technology, vol. 10, pp. 1689-1693, IOP Publishing, UK 1995.*

M. Granstrom, K. Petritsch, A. C. Arias, A. Lux, M. R. Andersson & R. H. Friend. 1998. Laminated fabrication of polymeric photovoltaic diodes. Nature 395, 257-260, Sep. 17, 1998.

Gebeyehu, D., Brabec, C.J., Saricifti, N.S., Vangeneugden, D., Kiebooms, R., Vanderzande, D., Kienberger, F., and H. Schnindler. 2002. Hybrid Solar Cells based on dye-sensitized nanoporous TiO2 electrodes and conjugated polymers as hole transport materials. Synthetic Metals 123, 279-287, (2002).

Greg P. Smestad, Stefan Spiekermann, Janusz Kowalik, Christian D. Grant, Adam M. Schwartzberg, Jin Zhang, Laren M. Tolbert, and Ellen Moons. 2002. A technique to compare polythiophene solid-state dye sensitized TiO2 solar cells to liquid junction devices. Solar Energy Materials & Solar Cells, in press, (2002).

Hongyou Fan, Yunfeng Lu, Aaron Stump, Scott T. Reed, Tom Baer, Randy Schunk, Victor Perez-Luna, Gabriel P. Lopez & C. Jeffrey Brinker. 2000. Rapid prototyping of patterned functional nanostructures, Nature 405, 56-60, May 4, 2000.

Alan Sellinger, Pilar M.Weiss, Anh Nguyen, Yunfeng Lu, Roger A. Assink, Weiliang Gong & C. Jeffrey Brinker. 1998. Continuous self-assembly of organic-inorganic nanocomposite coatings that mimic nacre. Nature 394, 256-260, Jul. 16, 1998.

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. Continuous formation of supported cubic and hexagonal mesoporous films by sol-gel dip-coating. Science 288, 652-656, Sep. 1997.

L. Schmidt-Mende, A. Fechtenkotter, K. Mullen, E. Moons,R. H. Friend, J. D. MacKenzie. 2002. Self-Organized Discotic Liquid Crystals for High-Efficiency Organic Photovoltaics. Science 293, 1119-1122, Aug. 2001.

Wendy U. Huynh, Janke J. Dittmer, A. Paul Alivisatos. 2002. Hybrid Nanorod-PolymerSolar Cells. Science 295, 2425-2427, Mar. 29, 2002.

Thuc-Quyen Nguyen, Junjun Wu, Vinh Doan, Benjamin J. Schwartz, Sarah H. Tolbert. 2000. Control of Energy Transfer in Oriented Conjugated Polymer-Mesoporous Silica Composites. Science 288, 652-656, Apr. 2000.

Heeger, A.J. 2000. Semiconducting and metallic polymers: the fourth and fifth generation of polymeric materials. Synthetic Metals 125, 23-42, (2002).

U.S. Appl. No. 10/303,665, entitled "Molding Technique for Fabrication of Optoelectronic Devices", to Martin R. Roscheisen et al, filed Nov. 22, 2002.

U.S. Appl. No. 10/319,406, entitled "Nano-Architected/Assembled Solar Electricity Cell" to Brian M. Sager et al, filed Dec. 11, 2002.

Merriam Webster Online Dictionary entry for "substantial" [online], [retrieved on Sep. 15, 2004]. Retrieved from the Internet, <URL: http://www.m-w.com/cgi-bin/dictionary?book=Dictionary &va=substantially>.

Merriam Webster Online Dictionary entry for "template" [online], [retrieved on Jul. 16, 2004]. Retrieved from the Internet ,<URL: http://www.m-w.com/cgi-bin/dictionary?book=Dictionary &va=template>.

Merriam Webster Online Dictionaery entry for "include" [online], [retrieved on Jun. 14, 2004]. Retrieved from the Internet ,<URL: http://www.m-w.com/cgi-bin/dictionary?book=Dictionary &va=include>.

D. Zhao et al. "Triblock Copolymer Syntheses of Mesoporous Silica with Periodic 50 to 300 Angstrom Pores" Science, 279, 548-552. (1998).

R. Ryoo et al. "Block-Copolymer-Templated Ordered Mesoporous Silica: Array of Uniform Mesopores or Mesopore-Micropore Network?" J. Phys. Chem. B. 104, 11465-11471. (2000).

M.H. Huang et al. "Catalytic Growth of Zinc Oxide Nanowires by Vapor Trasnport" Adv. Mater. 13, 113-116 (Jan. 2001).

M. H. Huang et al. "Ag Nanowire Formation within Mesoporous Silica", Chem. Commun., 2000, 1063-1964.

\* cited by examiner

*Primary Examiner*—Nam Nguyen
*Assistant Examiner*—Anthony Fick

(57) ABSTRACT

Charge-splitting networks, optoelectronic devices, methods for making optoelectronic devices, power generation systems utilizing such devices and method for making charge-splitting networks are disclosed. An optoelectronic device may include a porous nano-architected (e.g., surfactant-templated) film having interconnected pores that are accessible from both the underlying and overlying layers. A pore-filling material substantially fills the pores. The interconnected pores have diameters of about 1-100 nm and are distributed in a substantially uniform fashion with neighboring pores separated by a distance of about 1-100 nm. The nano-architected porous film and the pore-filling, material have complementary charge-transfer properties with respect to each other, i.e., one is an electron-acceptor and the other is a hole-acceptor. The nano-architected porous, film may be formed on a substrate by a surfactant temptation technique such as evaporation-induced self-assembly. A solar power generation system may include an array of such optoelectronic devices in the form of photovoltaic cells with one or more cells in the array having one or more porous charge-splitting networks disposed between an electron-accepting electrode and a hole-accepting electrode.

32 Claims, 9 Drawing Sheets

OPTOELECTRONIC DEVICE AND FABRICATION METHOD

CROSS-REFERENCE TO RELATED APPLICATION

This application claims the benefit of priority to U.S. Provisional Application Ser. No. 60/390,904 entitled "Nano-Architected/Assembled Solar Electricity Cell" filed on Jun. 22, 2002.

FIELD OF THE INVENTION

This invention generally relates to optoelectronic devices and more particularly to photovoltaic, e.g., solar cell, devices.

BACKGROUND OF THE INVENTION

Optoelectronic devices interact with radiation and electric current. Solar cells are a particular example of a useful class of optoelectronic devices. Organic solar cell technology has been actively pursued in the research community due to its promise of lower cost, easier manufacturability, and other potential advantages such as flexible sheets of solar cells and various novel form factors.

Unlike Silicon solar cells, where photon absorption results in the formation of a free electron and hole, photo-excitation in organic semiconductors leads to the formation of a bound electron/hole pair (an "exciton"). In most semiconducting (conjugated) polymers or small molecules, excitons form constantly under sunlight but cannot serve as a source for external electricity since the excitons have a very short lifetime, with the electron spontaneously recombining within an exciton diffusion path length of typically 10 nm. However, this number can vary, depending on the specific organic compound, between 2 nm and several hundred nm.

To serve as a source for electrical energy, the electron and the hole comprising an exciton in an organic material must be separated so that the charges can be collected at different electrodes. To do so in an optimal way, a charge-splitting and transporting network must be structured where the interfaces between electron- and hole-accepting materials are spaced in, e.g., respective 10-nm arrays within the active area of the solar cell device. At such interfaces, the electrons transfer into and move through the electron-accepting material, while the holes travel through the hole-accepting material.

Until recently, there have been only a few attempts to create a more optimal charge-splitting and transporting network in an organic or plastic solar cell.

For example, Halls et al (Nature vol. 376, p 498, 1995) constructed an interpenetrating mixture of organic polymers to increase the surface area between the electron and hole accepting materials. In particular, they mixed a blend of the conjugated polymers (i) soluble MEH-PPV (as a hole-acceptor) and (ii) CN-PPV (as an electron acceptor) in a ~1:1 ratio to create an active layer in an organic photovoltaic device that showed an external quantum efficiency (EQE) of 6%. This EQE was two orders of magnitude higher than the single layer structures of MEH-PPV (0.04%) and CN-PPV (0.001%). Higher efficiencies were not obtained since the phase separating network was essentially random with isolated "islands", phases/features that were too large (10-100 nm) and poor connectivity with the respective electrodes.

More recently, Huynh et al. (Science, vol. 295, pp. 2425-2427, 2002) have reported the fabrication of hybrid nanorod-polymer solar cells. These cells have an EQE of 54%, a polychromatic efficiency of 1.7%, and are composed of a random assembly of CdSe nanorods in poly-3(hexylthiophene). The totally random and highly inefficient placement of the nanorods lowered the solar cell efficiency from what would be expected if the charge-separating network was ordered and interconnected on the desired 10-nm scale.

Granstrom et al. (Cavendish Laboratory) have shown that phase separation on a scale of about 50 nm can be obtained through lamination of two semiconductive polymers giving polychromatic efficiency of 1.9% (Nature, vol. 385, pp. 257-260). The interpenetrating network obtained this way is still not on the optimal size scale (about 10 nm) for these polymers. Conjugated polymers are known to be better hole conductors than electron conductors.

Similarly, in recent work at Cambridge University, Schmidt-Mende et al. (Science, vol. 293, pp. 1119-1122, 2002) made spatially mixed thin films of perylene dye with a liquid crystal polymer, and achieved an EQE of 34%, a 1.9% polychromatic cell efficiency; however the efficiency was low owing to the 100-200-nm scale of the interpenetrating dye/polymer mixture used as a crude charge separating network.

In the solar cell devices constructed by these and other groups, the device architectures are sub-optimal compared to that needed for higher-efficiency devices. These prior art devices are limited by the extent to which excitons can be harvested to perform useful work. This is due to two key factors:

First, in cells created with semiconducting nanorods, the nanorods within the solar cells were randomly arranged within a medium of conducting polymer. Since many nanorods were only partially aligned and large clusters of nanorods (interspersed with areas of few rods) were present in the devices, many excitons traveling through the active layers of these devices did not reach an electron affinity junction before spontaneously recombining. As the spacing of the nanorods was random, some areas of the device had many nanorods within 10 nm of one another, while many other areas of the device had no nanorods at all within 10 nm of one another (resulting in "dead" absorption space). This factor decreased the efficiency of both electron and hole transfer at differential electron affinity junctions between nanorods and conducting polymer.

Second, in cells composed of mixtures of perylene dye and liquid crystal polymers, the rough 100-200 nm scale of the interpenetrating dye/polymer interface resulted in low interfacial surface area, and thus the failure of many excitons traveling through such devices to reach an electron affinity junction before spontaneously recombining.

Furthermore, the movement of electrons through the material required regularly and continuously spaced nanorods, which could collect and transport free electrons to the outer boundary of the nanorod layer. This factor decreased the hole and electron collection efficiency. All of these factors combine to reduce the efficiency of the device, and therefore the potential electric power that can be produced by the solar cell.

An alternative approach to building an organic solar cell has been developed by Michael Graetzel and his colleagues, who have constructed dye-sensitized, nanocrystalline $TiO_2$ based solar cells using a liquid electrolyte (Kohle et al., Advanced Materials, vol. 9, p. 904, 1997). In this device structure, referred to herein as the "Graetzel cell", 20 nm diameter nanospheres of $TiO_2$ are chemically bonded to Ruthenium pigment molecules. Upon absorbing light, the Ruthenium pigment molecules inject an electron into the titanium dioxide, which becomes positively charged as a result. Unfortunately, the Graetzel cell is relatively thick, e.g., several microns in thickness. The electric field in the Graetzel cell is directly proportional to the cell voltage and inversely proportional to the cell thickness. Since the voltage of the cell is essentially fixed and the cell is thick, the electric field of the Graetzel cell is not large enough to dominate charge migration. To overcome this, the $TiO_2$ nanospheres are immersed in an electrolyte. By immersing such a $TiO_2$ "paste" into a liquid redox electrolyte with $I^-/I_2$ species, the positive charge of the pigment molecules is neutralized, closing the circuit. The Graetzel cell is known to be able to generally reach 10% polychromatic efficiency. The shortcoming of the Graetzel cell is its lack of long-term stability, with no solution being known to effective seal the cell with the liquid $I^-/I_2$ electrolyte. Furthermore, the three-dimensional charge splitting network in a Graetzel cell is essentially random, presenting many curves for the liquid electrolyte to penetrate. Therefore, even if a Graetzel cell uses a solid electrolyte, the pore size distribution, pore spacing and pore filling are less than optimal.

Thus, there is a need in the art for optoelectronic devices, including solar cells that overcome the above disadvantages and a corresponding need for methods and apparatus for producing such devices.

SUMMARY OF THE INVENTION

The disadvantages associated with the prior art are overcome by embodiments of the present invention directed to charge-splitting networks, optoelectronic devices incorporating such charge-splitting networks, methods for manufacturing such networks and devices and power generation systems utilizing such charge-splitting networks.

According to an embodiment of the invention, an optoelectronic device includes a porous nano-architected film and a pore-filling material that substantially fills the pores in the porous nano-architected film. The pore-filling material and porous nano-architected film have complementary charge-transfer properties. The porous nano-architected film has interconnected pores of between about 1 m and about 100 nm in diameter that are distributed in a substantially uniform fashion with neighboring pores separated by a distance of between about 1 nm and about 100 nm. The pores are interconnected and accessible from an underlying layer and/or overlying layer (if any). Preferably, the porous nano-architected film is a surfactant-templated porous film.

According to an embodiment of a method for making such an optoelectronic device, the nano-architected porous film may be formed on a substrate by a surfactant temptation technique. One such technique involves disposing on a substrate a sol that includes one or more alkoxides, one or more surfactants, one or more condensation inhibitors, water, and ethanol. Evaporating the ethanol from the sol forms the surfactant-templated porous film. The sol may be disposed on the substrate by any suitable technique, such as web coating, dip coating, spin coating or spray coating, etc.

According to another embodiment of the invention, a solar power generation system may include an array of photovoltaic cells, wherein one or more cells in the array includes one or more porous charge-splitting networks disposed between an electro-accepting electrode and a hole-accepting electrode. Two or more cells in the array may be electrically connected in series.

In embodiments of the present invention, the size of the pores as well as the pore spacing and orientation can potentially be controlled and tailored such that the pores can be filled substantially and easily with e.g., dyes or semiconductive polymers from solution (e.g., by dip coating, spray coating, spin coating, web coating, and the like.

Embodiments of the present invention provide new and useful optoelectronic devices including photovoltaic devices, as well as power generation systems that may be formed relatively inexpensively and on a large scale.

DETAILED DESCRIPTION OF THE INVENTION

Figure 1A:
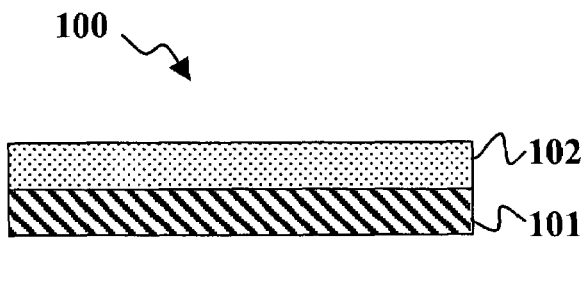
FIG. 1A depicts a solar cell according to the prior art

Contents
I. Glossary
II. General Overview
III. Solar Cell Device Architecture
IV. Alternative Embodiments
V. Conclusion

I. Glossary

The following terms are intended to have the following general meanings as they are used herein:

Device: An assembly or sub-assembly having one or more layers of material.

Semiconductor: As used herein, semiconductor generally refers to a material characterized by an electronic bandgap typically between about 0.5 eV and about 3.5 eV.

Hole-Acceptor, Electron-Acceptor: In the case of semiconductor materials, hole-acceptor and electron-acceptor are relative terms for describing charge transfer between two materials. For two semiconductor materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Complementary charge-transfer properties: As used herein, a first and second semiconductor material are said to have complementary charge-transfer properties with respect to each other when the first material is a hole-acceptor with respect to the second and the second is an electron-acceptor with respect to the first or vice versa.

Nano-Architected Porous Film: As used herein "nano-architected porous film" generally refers to a film of material having features characterized by a width, or other characteristic dimension, on the order of several nanometers ($10^{-9}$ m) across. Nano-architected porous films may be produced by several techniques, including:

(a) Intercalation and/or grafting of organic or polymeric molecules within a mineral lamellar network comprised of clays, phosphates, phosphonates, etc. The lamellar compounds serve as a network host which preserves the pre-established structural order. Organic molecules are then inserted or grafted into this pre-structured network (which is comprised of mineral(s)).

(b) Synthesis by electrocrystallisation of hybrid molecular assemblies. This synthesis technique drives the construction of highly organized mineral networks with relatively long-range order that can be controlled and adjusted for electronic intermolecular transfer.

(c) Impregnation of preformed inorganic gels. In an example of this technique, a silica xerogel can be formed by hydrolysis and polycondensation of silicon alkoxides with organic monomers (e.g. with monomers that are susceptible to polymerization within the porous gel structure). Methylmethacrylate (MMA) is an example of a suitable organic monomer and the inorganic-organic hybrid obtained after polymerization of the MMA has optical and mechanical properties often superior to the individual components.

(d) Synthesis from heterofunctional metallic alkoxides or silsesquioxannes: Precursors of this kind have the formula $R_xM(OR')_{n-x}$ or $3(R'O)Si-R-Si(OR')3$, where R and R' are either hydrogen (H) or any organic functional group, and M is a metal. Typically R and R' involve oxygen, e.g., —O—R and —O—R'. M may be any transition metal, e.g., titanium, zinc, zirconium, copper, lanthanum, niobium, strontium, etc. The hydrolysis of alkoxy groups (OR') followed by a condensation reaction will form the mineral network and the R groups will imprint in the network the organic function.

(e) Synthesis of hybrid through the connection of well-defined functional nanobuilding Blocks. The pre-formatted species or building blocks could be in this case oxo-metallic clusters, nanoparticles (CdS, CdSe, . . . ), metallic or oxides colloids, organic molecules or oligomers. These blocks are functionalized during or after their synthesis with complementary species for tailoring the interface between organic and inorganic domains. A review of this strategy has been presented in Comments in Inorganic Chemistry 20(4-6), 327-371 (1999), which is incorporated herein by reference.

(f) Templated growth of inorganic or hybrid networks by using organic molecules and macromolecules as structure directing agents. In general, molecules like amines, alkyl ammonium ions, amphiphilic molecules or surfactants can be used as templates to build a structured mineral network. Materials of the zeolites families are among the most intensively investigated systems. Molecular and supramolecular interactions between template molecules (surfactants, amphiphilic block copolymers, organogelators, etc. . . . ) and the growing hybrid or metal-oxo based network permit the construction of complex hybrid hierarchical architectures.

Surfactant Templation: In general, surfactant templation is a particular subcategory of templated growth. As used herein, surfactant templation refers an approach toward achieving pore size control of inorganic or organic frameworks, e.g., by using surfactants as templates to build a structured mineral network. Surfactant templation may be used to prepare a high-porosity surfactant-templated porous thin film. Surfactant temptation includes the sol-gel approach described below.

Optoelectronic Device: A device that interacts with radiation and electric current. Such a device could be a radiation-emitting device, e.g. a light-emitting diode (LED) or laser, or a radiation absorbing device, e.g. a photodetector/counter, photovoltaic cell (solar cell) or radiation-driven electrolysis cell.

Solar Cell: A photovoltaic device that interacts with radiation (often in the form of sunlight) impinging on the device to produce electric power or voltage.

Organic Solar Cell: A type of solar cell wherein an active photoelectric layer is fabricated, either partly or entirely, using organic materials comprising, e.g., polymers, dyes, pigments (including mixtures) that are predominantly carbon based compounds. These materials may be insulating, conductive or semiconductive.

Radiation: Energy which may be selectively applied including electromagnetic energy having a wavelength between $10^{-14}$ and $10^4$ meters including, for example, gamma radiation, x-ray radiation, ultraviolet radiation, visible light, infrared radiation, microwave radiation and radio waves.

Material: The term "material" is used herein to refer to solid-state compounds, extended solids, extended solutions, clusters of molecules or atoms, crystals, polymers, dyes, particularly including conjugated polymers and dyes.

Inorganic Materials: Materials which do not contain carbon as a principal element. The oxides and sulphides of carbon and the metallic carbides are considered inorganic materials. Examples of inorganic compounds include, but are not restricted to, the following:

(a) Intermetallics (or Intermediate Constituents): Intermetallic compounds constitute a unique class of metallic materials that form long-range ordered crystal structures below a critical temperature. Such materials form when atoms of two metals combine in certain proportions to form crystals with a different structure from that of either of the two metals (e.g., NiAl, $CrBe_2$, CuZn, etc.).

(b) Metal Alloys: A substance having metallic properties and which is composed of a mixture of two or more chemical elements of which at least one is a metal.

(c) Magnetic Alloys: An alloy exhibiting ferromagnetism such as silicon iron, but also iron-nickel alloys, which may contain small amounts of any of a number of other elements (e.g., copper, aluminum, chromium, molybdenum, vanadium, etc.), and iron-cobalt alloys.

(d) Inorganic polymers such as polysilanes or other non-carbon based polymers or monomers.

(e) Ceramics: Typically, a ceramic is a metal oxide, boride, carbide, nitride, or a mixture of such materials. Examples of such materials include, among others, alumina, zirconia, Titania ($TiO_2$) silicon carbide, aluminum nitride, silicon nitride Organic Materials: Compounds, which principally consist of carbon and hydrogen, with or without oxygen, nitrogen or other elements, except those in which carbon does not play a critical role (e.g., carbonate salts). Examples of organic materials that can be synthesized using the methods of the present invention include, but are not restricted to, the following:

(a) Organic Dyes and pigments such as derivatives of perylenes, phthalocyanines, merocyanines, terylenes, squaraines, ruthenium, and pentacene.

(b) Polymers: Materials consisting of large macromolecules composed of many repeating units. Examples of such repeating units include, e.g., dyes or pigments. Polymers can be natural or synthetic, cross-linked or non-crosslinked, and they may be homopolymers, copolymers, or higher-ordered polymers (e.g., terpolymers, etc.). Examples of polymers include, but are not limited to, the following: polyurethanes, polyesters, polycarbonates, polyethyleneimines, polyacetates, polystyrenes, polyamides, polyanilines, polyacetylenes, polypyrroles, conjugated polymers, (e.g., semiconductive polymers such as poly(pheylene), polyphenylvinylene, poly(isothianaphthene), polythiophene, poly(thienylenevinylene), polyfluorenes, polyparaphenylene, poly(isothianaphthene), poly(squaraine), and polymers containing $C_{60}$ or dyes such as perylenes or phthalocyanines) or conductive polymers such as doped PEDOT (Baytron) or polyaniline or polyacetylene. These may be synthesized or grafted onto one another using either classical organic chemistry techniques or using enzymes to catalyze specific reactions.

II. GENERAL OVERVIEW

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Figure 1B:
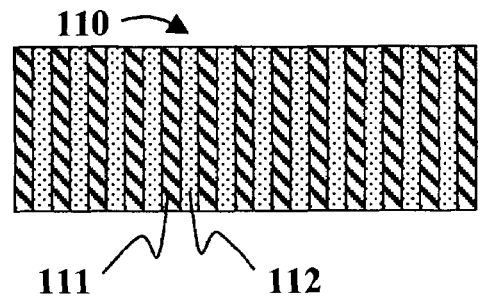
FIG. 1B depicts a charge-splitting network architecture that may be used according to an embodiment of the present invention.
Figure 6:
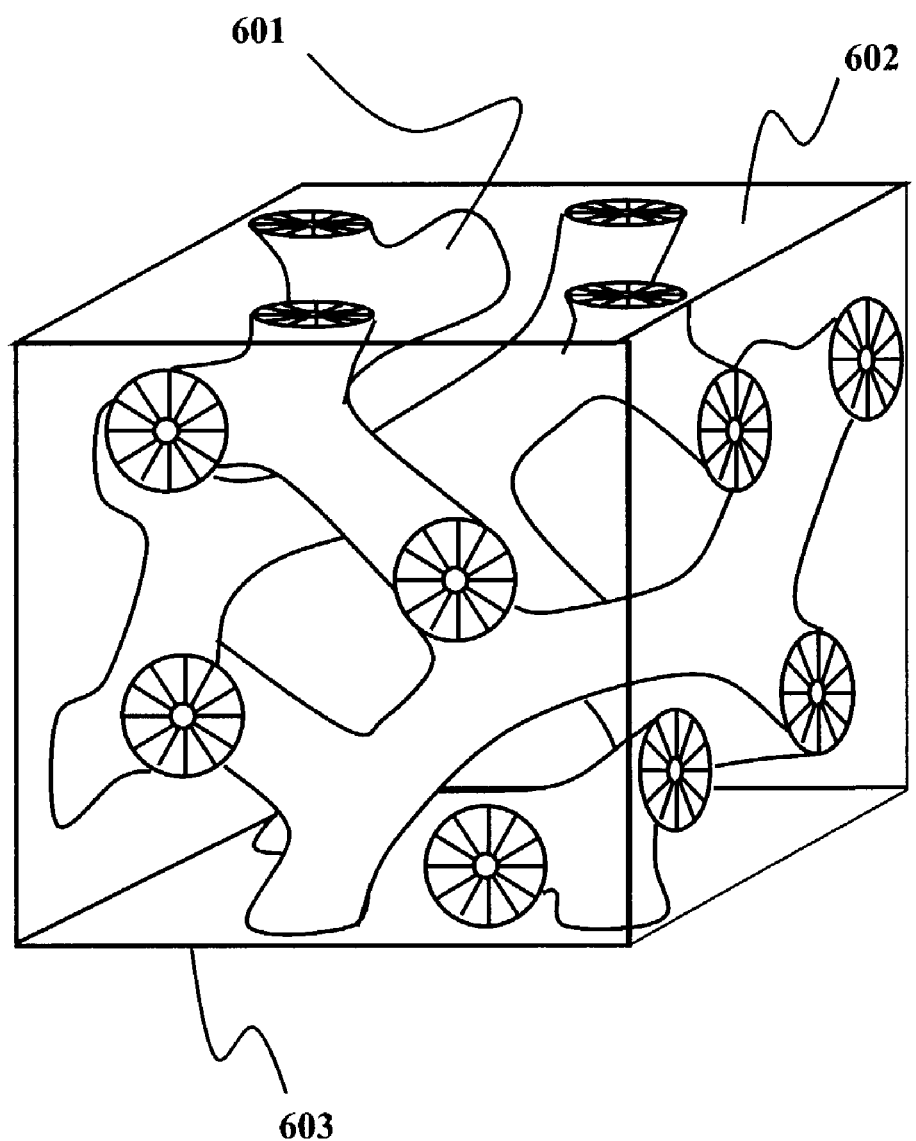
FIG. 6 depicts an isometric close-up view of a portion of possible a porous film structure.

As shown in FIG. 1A, a conventional charge-splitting junction 100 is a flat plane, with a low interfacial surface area between a hole-transporting layer 101 and an electron-transporting layer 102. As a result of the low interfacial surface area, the junction 100 has only a modest potential for harvesting excitons. To optimize the efficiency of a charge-splitting network, the interfacial surface area between the hole- and electron-accepting materials should be reachable for excitons. According to an embodiment of the present invention, this can be achieved as shown in FIG. 1B through the creation of a three-dimensional nanoscale charge-splitting network. 110. The charge-splitting network 110 has interpenetrating regions with complementary charge-transfer properties, e.g., an electron-transporting material 111 and hole-transporting material 112, that alternate in a substantially uniform fashion on a scale less than or equal to the exciton path length. The charge-splitting network 110 is shown in simplified form for the sake of clarity. One possible variation, among others, of a configuration of a charge-splitting network 110 is shown in FIG. 6.

The charge-splitting network 110 may be in the form of a porous nano-architected film having interconnected pores filled with a pore-filling material, wherein the porous nano-architected film and pore filling material have complementary charge-accepting properties. The porous nano-architected film may contain regularly spaced pores roughly 1 nm to 100 nm (more preferably 2 nm to 50 nm) in diameter where neighboring pores are between about 1 nm and about 100 nm (more preferably 2 nm to 50 nm) apart measured, e.g., from nearest edge to nearest edge. The pores are preferably interconnected with each other and accessible from any underlying layer and/or overlying layer. Such a porous nano-architected film may be a surfactant templated porous film. One approach to construct such a surfactant-templated porous film is to use sol-gel based self-assembly of porous nanofilms to construct a 2-50 nm scale, solid-state charge-splitting network for solar cells.

III. DEVICE ARCHITECTURE

According to an embodiment of the present invention, an optoelectronic device includes (1) a low-cost, highly reproducible porous nano-architected film having interconnected pores filled with (2) a pore-filling material having complementary charge-transfer properties with respect to the porous nano-architected film. The pore-filling material fills pores in the surfactant templated porous film to create an interpenetrating, nanoscale charge-splitting and transporting network for optoelectronic devices such as photovoltaic cells. Although, examples of this embodiment is described in terms of an electron accepting porous film and a hole-accepting pore-filling material, the charge transfer properties of the porous film and pore filling material may be reversed, i.e., the porous film may be a hole acceptor with respect to the pore-filling material, which is an electron acceptor with respect to the porous nano-architected film. Such an optoelectronic device may be a photovoltaic device, such as a solar cell. Alternatively, the optoelectronic device may be a radiation-emitting device, such as an LED, laser, etc.

Figure 2:
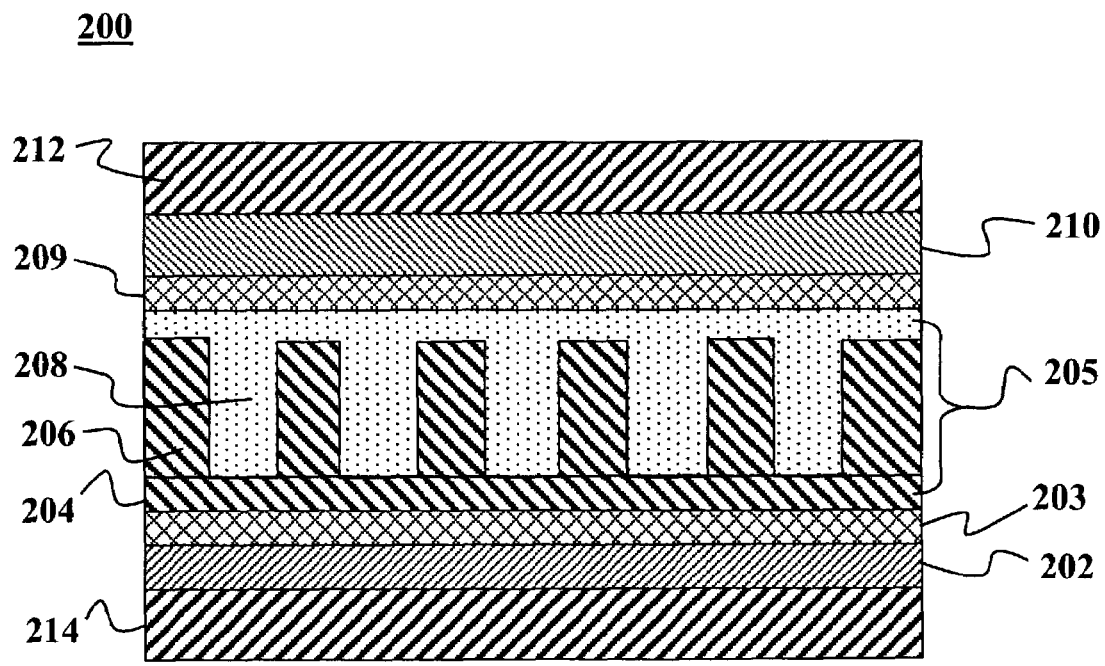
FIG. 2 depicts an example of a schematic of a device structure for a photovoltaic cell according to an embodiment of the present invention.

FIG. 2 depicts an example of a device structure for an optoelectronic device 200 according to an embodiment of the present invention. The photovoltaic cell 200 generally includes a first electrode 202, a charge-transport film 204, a charge-splitting network 205 having an electron-accepting surfactant-templated porous film 206 and a hole-accepting pore-filling material 208, and a second electrode 210. The cell 200 may optionally be protected by encapsulants 212, 214. Furthermore, a first optional interface layer 203 may be disposed between the charge transport layer 204 and the first electrode to improve charge injection into the first electrode. The interface layer 203 may also improve mechanical properties such as flexibility and resistance to short circuits. A similar second optional interface layer 209 may be disposed between the pore-filling material 208 and the second electrode 210.

The first electrode 202, which may serve as a base for the device 200, may be in the form of a commercially available sheet material such as such as C- or Cu-coated Steel Foil. The charge transport film 204 and surfactant-templated porous film 206 may both be solgel based and may both be composed of the same material, e.g., an electron-accepting material such as Titania ($TiO_2$) zinc oxide ($ZnO_2$), zirconium oxide, lanthanum oxide, niobium oxide, tungsten oxide, strontium oxide, calcium/titanium oxide, sodium titanate, potassium niobate. Alternatively, the charge-transport film 204 may be made from different materials. The material used in the surfactant-templated porous film 206 and/or charge transport film 204 may be altered to optimize its radiation absorption and/or charge transport properties, e.g., through carbon or hydrogen doping. The charge-transport film 204 provides electrical contact between the surfactant-templated porous film 206 and the substrate electrode 202. By way of example, and without limitation, the charge transport film 204 may be an electron-accepting sol-gel based non-porous Titania film.

The nano-architected surfactant-templated porous film 206 contains substantially uniformly distributed, e.g., regularly spaced, pores roughly 1 nm to 100 nm in diameter and more preferably, about 5 nm to about 15 nm in diameter. In general, neighboring pores are between about 1 nm and about 100 nm apart measured, e.g., from nearest edge to nearest edge. More preferably, the pores are between about 5 nm apart and 15 nm apart, edge to edge. Where organic semiconductors are used for either the surfactant-templated porous film 206 or the pore-filling material 208, it is desirable for the size and spacing of the pores to be on the order of the exciton diffusion length in the respective organic semiconducting material. The substantially uniform distribution of the pores enhances the overall conversion efficiency of the photovoltaic cell 200.

The charge-splitting network 205 is shown in simplified form for the sake of clarity. Although the pores in the charge-splitting network 205 may be aligned substantially parallel to each other as shown in FIG. 2, the pores are preferably interconnected and accessible from both neighboring layers, e.g. electrodes 202, 210 or interface layers 203, 209. One possible variation, among others, of a possible configuration of the pores in a charge-splitting network is shown in FIG. 6.

The pore-filling material 208 fills the pores in the surfactant-templated porous film 206. The pore-filling material 208 has complementary charge-accepting properties with respect to the surfactant-templated porous film 206. The charge-transport film 204 inhibits or prevents direct contact between the pore-filling material 208 and the substrate electrode 202. The pore-filling material 208 may cover the surfactant-templated porous film 206 in such a way as to inhibit direct contact between the surfactant-templated porous film 206 and the second electrode 210. By way of example, and without loss of generality, where the surfactant-templated porous film may be made from an electron-accepting material, e.g., Titania, the pore filling material 208 may be a semiconducting, e.g., hole-accepting, organic material. Examples of suitable semiconducting organic materials include conjugated polymers such as poly(phenylene) and derivatives thereof, poly(phenylene vinylene) and derivatives thereof (e.g., poly(2-methoxy-5-(2-ethylhexyloxy)-1,4-phenylene vinylene (MEH-PPV), poly(paraphenylene vinylene), (PPV)), poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable semiconducting polymers include organometallic polymers, polymers containing perylene units, poly(squaraines) and their derivatives. Other suitable semiconducting pore-filling materials include organic pigments or dyes, azo-dyes having azo chromofores (—N=N—) linking aromatic groups, phthalocyanines including metal-free phthalocyanine; (HPc), perylenes, naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1, 3,8,10-tetrone, and 2,9-Bis-(1-hexyl-hept-1-yl)-anthra[2,1,9-def:6,5,10-d'e'f']diisoquinoline-1,3,8,10-tetrone.

Alternatively, the pore-filling material may be a hole-accepting inorganic material such as copper oxide. Furthermore, the pore-filling material 208 may be a combination of two or more compounds, e.g., solubilized buckminsterfullerene ($C_{60}$) and/or a dye, such as perylene and/or a polythiophene derivative. The combination of the electron-accepting surfactant-templated porous film 206 and the hole-accepting pore-filling material 208 creates a nanoscale, high-interfacial area charge-splitting network 205.

The second electrode 210 provides an electrical connection to the pore-filling hole-accepting material 208 filling the pores. Preferably, the substrate electrode 202, the second electrode 210 or both electrodes 202, 210 are made from a material that transmits radiation of interest to the photovoltaic process that takes place within the cell 200. Examples of suitable transparent conducting materials for the electrodes 202, 210 include doped tin oxide ($SnO_2$), e.g., fluorinated tin oxide $F:SnO_2$, and indium-tin oxide (ITO).

The optional interface layers 203, 209 may be made from conducting polymers, such as PEDOT or polyaniline. Alternatively, the interface layers 203, 209 may include a material, such as lithium fluoride (LiF) that improves charge injection into the electrodes 202, 210 or smoothes out the surface roughness of the electrodes 202, 210.

The optional encapsulants 212, 214 protect the cell 200 from the surrounding environment. Examples of suitable encapsulant materials include one or more layers of polyethylene terephthalate (PET), and Mylar. Ethylene vinyl acetate (EVA) may be used in either case in conjunction with the other encapsulant. The encapsulants 212, 214 may also include nitrides, oxides, oxynitrides or other inorganic materials that protect against exposure to water or air. The encapsulants 212, 214 may also absorb UV-light to protect organic materials disposed between the encapsulants 212, 214.

There are many possible variations on the basic photovoltaic cell described in the example above. For example, the surfactant-templated porous film 206 may be made from metal oxides, other than $TiO_2$, or other semiconducting compounds that are capable of accepting electrons from the pore-filling material 208 and transporting the electrons. Furthermore, the surfactant-templated porous film 206 may be made from metal oxides or other semiconductor compounds (e.g., conjugated polymers or dyes) that are hole-acceptors with respect to the pore-filling material 208. One example, among others, of such a semiconductor material is copper oxide (CuO). In such a case, the pore-filling material 208 would be an electron accepting material with respect to the material of the surfactant-templated porous film 206.

III. FABRICATION OF PHOTOVOLTAIC DEVICES

Charge-splitting networks of the types described above and optoelectronic devices of the type depicted in FIG. 2 may be manufactured in accordance with an inventive method. An example of an embodiment of such a method is 300 illustrated by the flow diagram of FIG. 3 and the series of schematic diagrams shown in FIGS. 4A-4F.

Figure 4A:
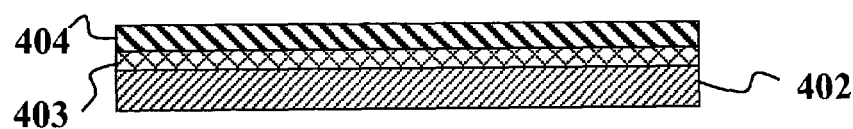
FIGS. 4A-4F depict a series of schematic diagrams illustrating the fabrication of a photovoltaic cell according to the flow diagram of FIG. 3.
Figure 4B:
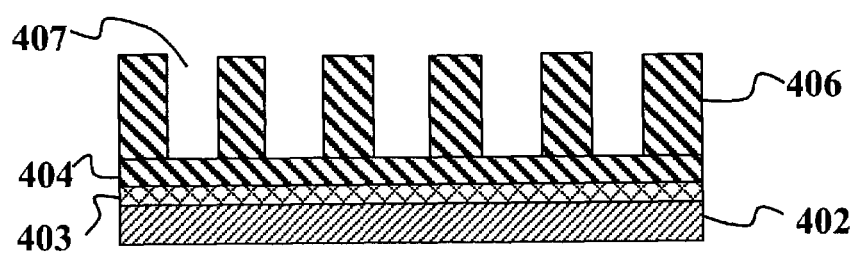

The method 300 may begin at 301 by optionally forming a first interface layer 403 on a first electrode 402. At 302 an optional first charge-transport film 404 may be formed on either the first electrode 402 or the first interface layer 403 as shown in FIG. 4A. By way of example, a commercially available sheet material such as such as C- or Cu-coated Steel Foil may be used as the substrate electrode 402. The first charge-transport film 404 may be a sol-gel based non-porous Titania (TiO$_2$) film. The non-porous TiO$_2$ film may be formed, e.g., using web-coating, dip-coating, spin-coating or spray-coating based deposition. Subsequently, at 304, a porous nano-architected film, such as a surfactant-templated film 406, having pores 407 is formed on the charge-transport layer 404 as shown in FIG. 4B. The configuration of the pores 407 is shown in simplified form for the sake of clarity. Although the pores 407 may be aligned substantially parallel to each other as shown in FIGS. 4B-4F, the pores 407 are preferably interconnected and accessible from both neighboring layers, e.g. electrodes or interface layers. One example, among others, of a possible configuration of the pores 407 is shown in FIG. 6.

Figure 4C:
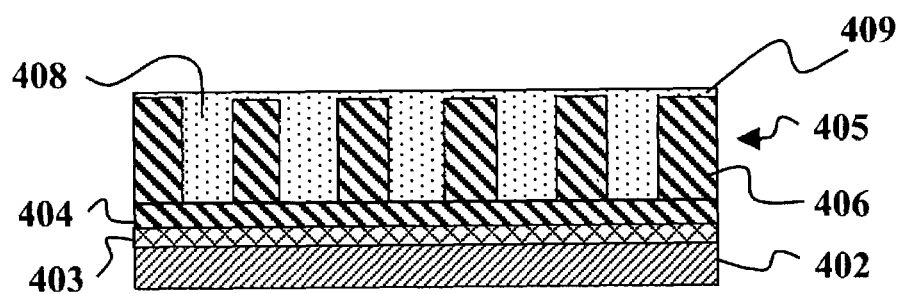

In general, the charge transport film 404 and surfactant-templated film 406 may be made from any suitable material, including those described above with respect to the porous film 206 of FIG. 2. The surfactant-templated film 406 may be a made using a variety of surfactant temptation techniques such as evaporation induced self-assembly, etc. The surfactant-templated film 406 may be formed, e.g. by web-coating, dip-coating, spin-coating or spray coating based deposition. By appropriate choice of the coating parameters, the surfactant-templated porous film 406 can be formed such that the pores 407 are roughly 2 nm to 100 nm in diameter and neighboring pores are between about 2 nm and about 100 nm apart. The surfactant-templated porous film 406 is dried and, at 306, the pores 407 are then filled with a pore-filling material 408, as shown in FIG. 4C. The pore-filling material 408 has complementary charge-accepting properties with respect to the surfactant-templated porous film 406. The pore-filling material 408 may be made of the materials described above the pore-filling material 208 of FIG. 2. By way of example, if the surfactant-templated porous film 406 may be made of Titania, the pore-filling material 408 may be an organic material, such as polythiophene, or an inorganic material, such as copper oxide. The combination of the pore-filling material 408 and the surfactant-templated porous film 406 creates a nanoscale, high-interfacial area charge-splitting and transporting network layer 405. At 308, a second charge-transport film 409, e.g., polythiophene may optionally be applied to the exposed surface of the pore-filling material 408. In general, the charge transport film may be made of any of the materials suitable for the pore-filling material 408, e.g., as described above.

Figure 4D:
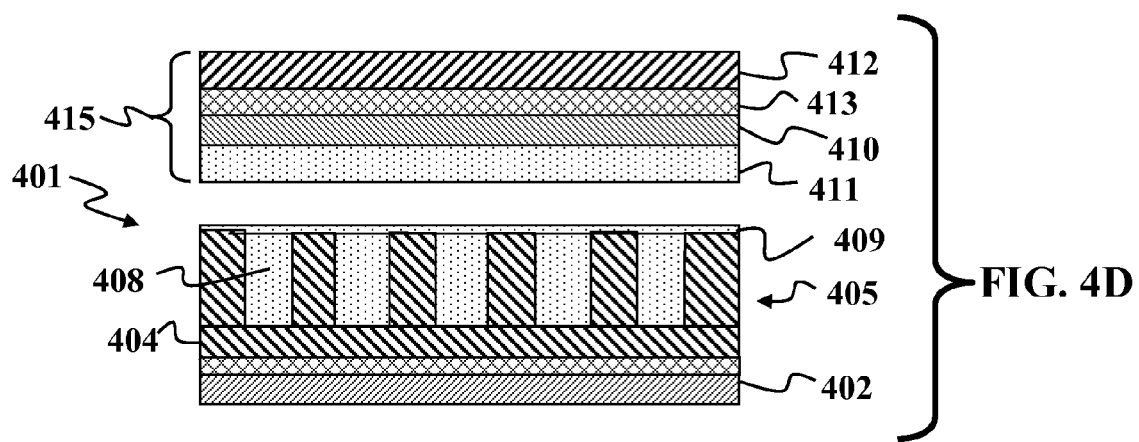
Figure 4E:
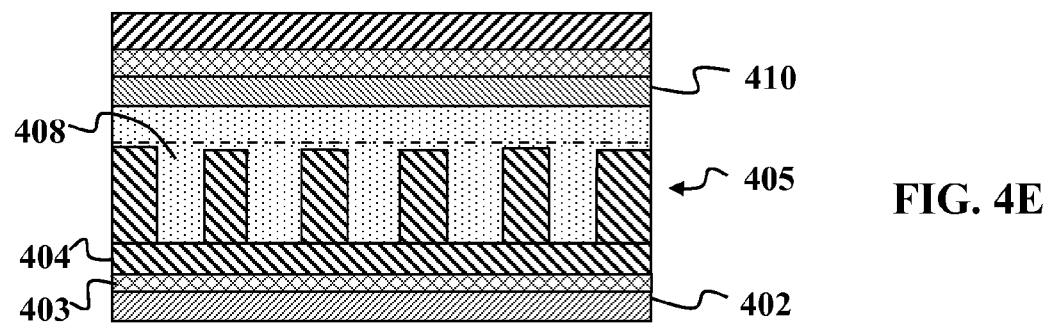

At 310, the pore-filling material 408 is then put in electrical contact with second electrode 410, e.g. via the second charge-transport film 409. For example, the substrate 402, porous film 406, pore filling material, etc., may comprise one section 401 of a photovoltaic device. As shown in FIG. 4D, a second section 415 may be built using a commercially-available sheet material 412 such as Mylar (Polyethylene Terephthalate, PET) as a transparent substrate. The sheet material 412 may be coated with a transparent conducting material (e.g. a layer of tin oxide or indium tin oxide) to form the electrode 410. An optional second interface layer 413 may be applied to the second electrode 410 An optional layer of charge-transport material 411 such as polythiophene may be applied to the transparent second electrode 410 or the second interface layer 413 to complete the second section 415. The first and second sections 401, 415 may then be laminated together at the homo-junction (dashed lines) between the pore-filling material layer 408 and the charge transport material layer 409, as shown in FIG. 4E.

Figure 4F:
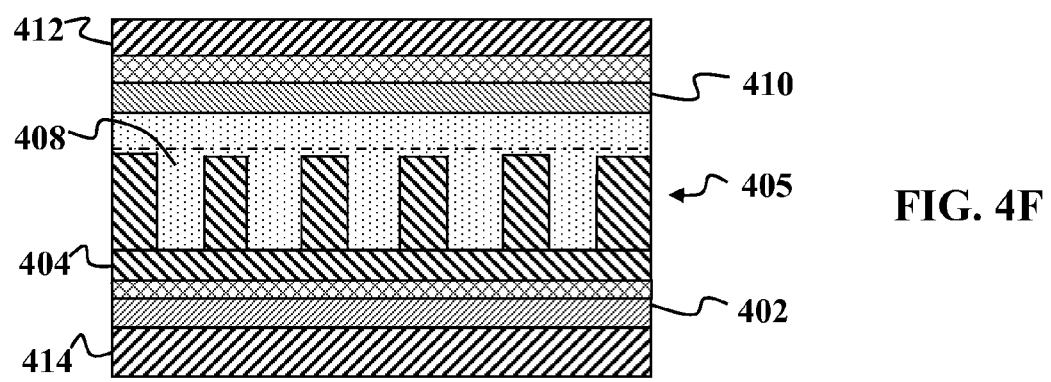

In an optional step 312 the resulting device may be encapsulated. For example, an encapsulant layer 414 may cover the exposed surface of the substrate electrode 402 as shown in FIG. 4F. Alternatively, the substrate electrode 402 may be mounted to the encapsulant layer 414 prior to forming non porous film 404 or the porous film 406. Note that in this example, the sheet material 412 also may be used as an encapsulant layer.

The key steps in the method 300 are forming the surfactant-templated porous film (304) and filling the pores in the porous film with pore-filling material (306). Some approaches to accomplishing these two steps along with approaches to other steps in the method 300 are discussed in detail below.

A. Construction of Surfactant-Templated Porous Films

Figure 3:
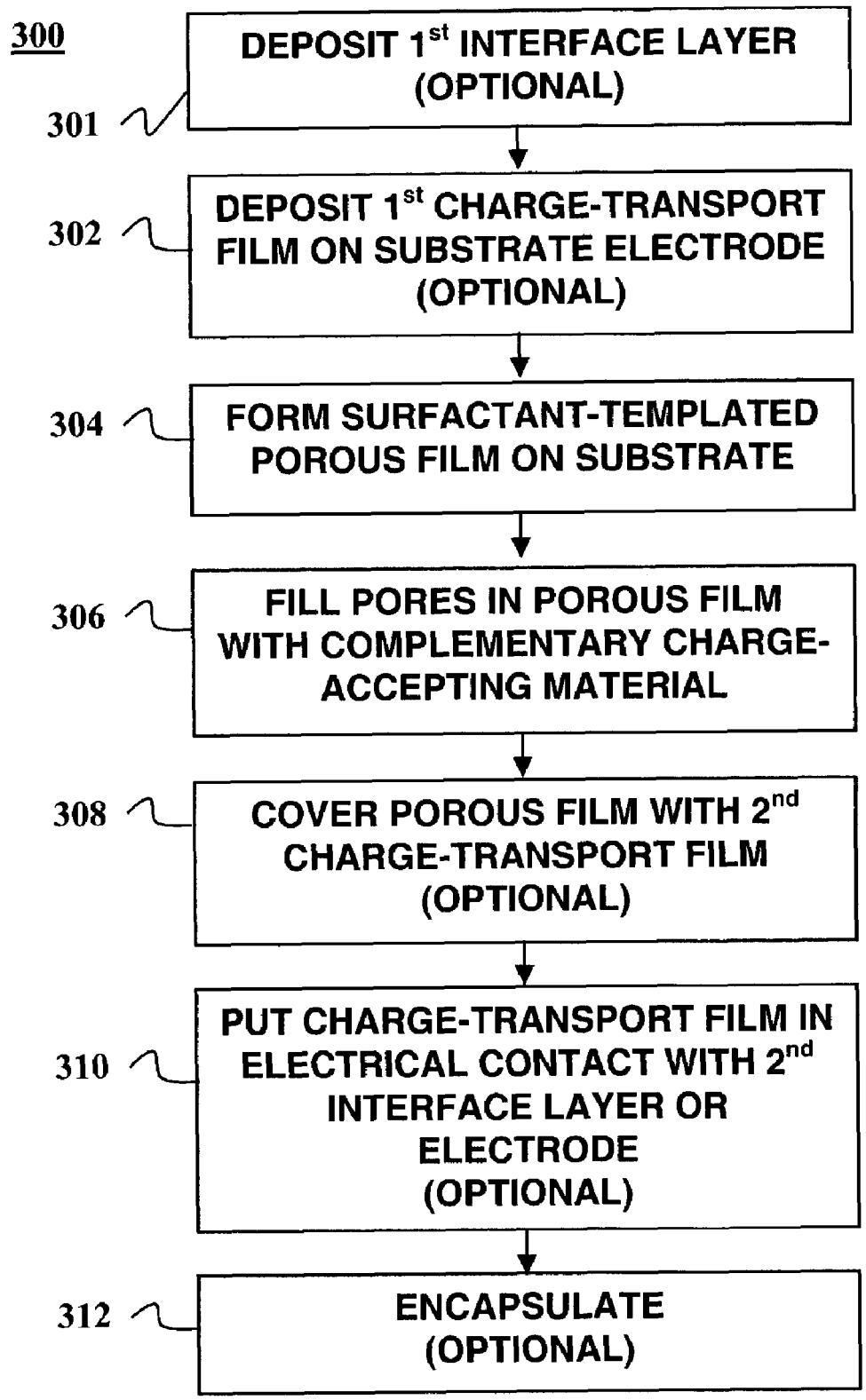
FIG. 3 depicts a flow diagram illustrating an example of a method for making a photovoltaic device of the type shown in FIG. 2 according to an embodiment of the present invention

With respect to step 304 if FIG. 3, there are several approaches to forming the porous nano-architected film described above. One such approach, among others, involves templated growth of inorganic or hybrid networks, e.g., by surfactant temptation. Examples of surfactant-templation techniques for producing porous films are described, e.g., by Brinker, et al in U.S. Pat. No. 6,270,846, the disclosures of which are incorporated herein by reference. One particular surfactant-templation approach, among others, utilizes evaporation-induced self-assembly (EISA) to form a meso-organized liquid-crystal template. This process has been well developed for the fabrication of porous silica, where the substrate is first coated with polysiloxane surfactants in an ethanol solution. Upon removal from the dipping solution, the ethanol evaporates within 60-120 seconds. As evaporation proceeds, the molecules with a siloxane-surfactant micelle rearrange themselves to minimize their collective energy level. This process continues as the molecules further rearrange their nanoscale organization into highly regular liquid-crystalline mesophases. The resulting porous films contain a high and tunable density of regular, interconnected pores spaced in approximately 5 nm repeating patterns, with pore diameters of about 5 nm, depending on the choice of surfactant. Variability in pore diameter is less than 2%. This nanoscale architecture is highly reproducible, and can be permanently fixed by heating. The resulting nanofilm is extremely stable and mechanically robust. Pore diameter and pore spacing may be adjusted by (1) choice of surfactant, (2) concentration of surfactant, (3) the use of block co-polymers, (4) temperature, (5) humidity level, (6) deposition procedure and speed, or some combination of two or more of (1), (2), (3), (4), (5) and (6).

Figure 5:
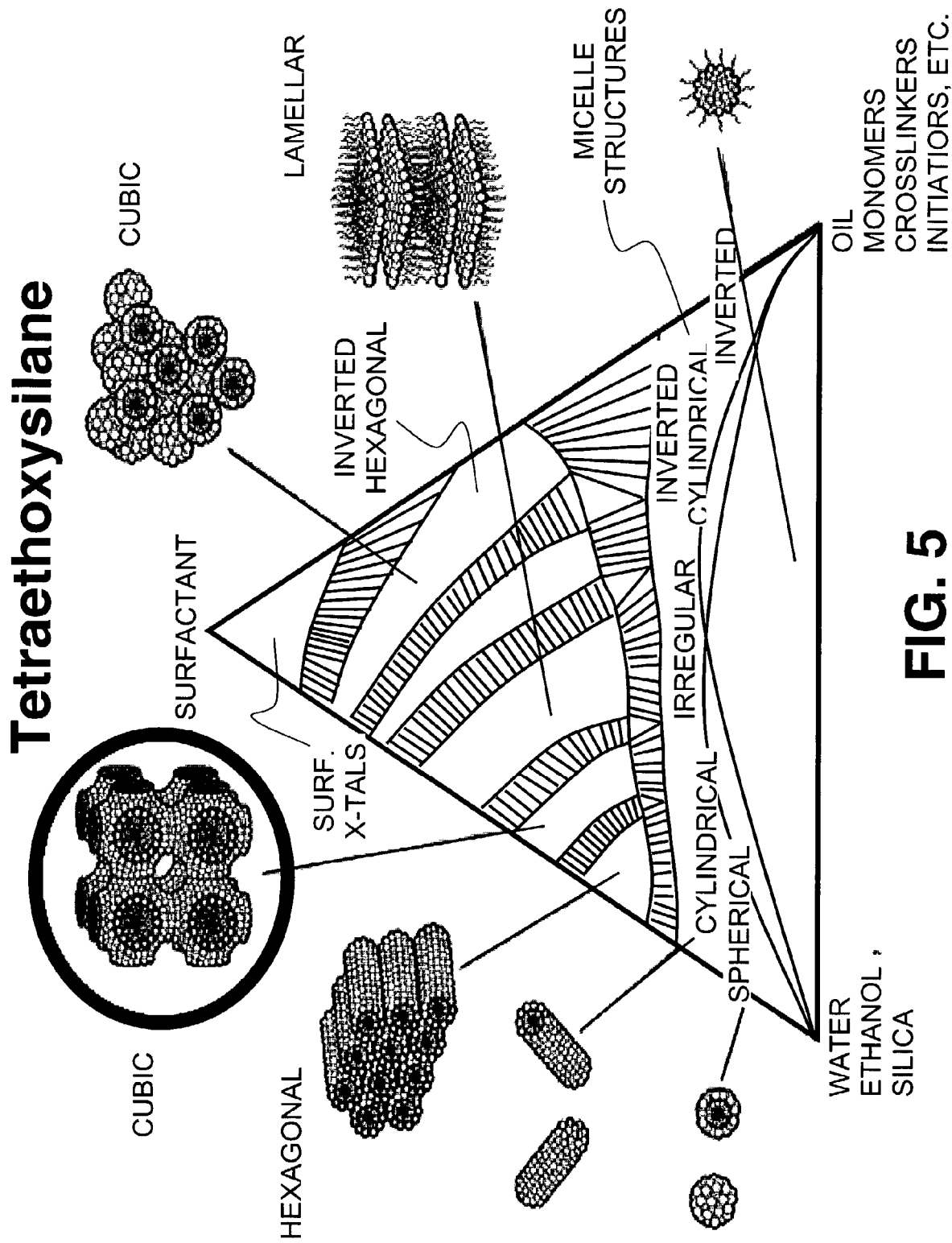
FIG. 5 depicts a ternary phase diagram representing the synthesis of a variety of architectures within a porous film.

FIG. 5 depicts a ternary phase diagram representing the synthesis of a variety of architectures within a porous film. The structure circled in FIG. 5 depicts a simplified and somewhat idealized desirable morphology for the porous film. A possible variation of this morphology is shown in FIG. 6, which depicts a portion of a surfactant-templated porous film 600. The film 600 has numerous pores 601 that are interconnected with each other. Furthermore, the pores 601 provide a continuous path, through one or more pores, between a first surface 602 and a second surface 603. The path through the pores 601 provides access to the pores from a layer overlying or a layer underlying the surfactant-templated porous film 600. When the pores are filled with a semiconducting pore-filling material, charges have a path to migrate through the pore filling material from the overlying layer to the underlying layer and/or vice versa.

Porous silica does not have the appropriate electron-accepting properties required for the charge-splitting network layer 405 in an optoelectronic device such as a solar cell. However, a similar sol-gel based synthetic approach may be used to produce, e.g., porous Titania or other metal oxide films. With a band gap of 3.2 eV, Titania ($TiO_2$) absorbs light from the near-ultraviolet region of the spectrum, and the material has relatively high charge mobility. Thus Titania does have the proper electronic properties for effective charge-splitting. Furthermore, Titania is widely available and relatively inexpensive.

To produce a Titania-based porous oxide by evaporation-induced self-assembly using a sol-gel technique, the higher reactivity of the titanium toward condensation (relative to silicon) must be controlled during the self-assembly process by the addition of any of a variety of stabilizing agents and hydrolysis-condensation inhibitors such as hydrogen peroxide, HCl, or triethanolamine. In particular, to synthesize the sol, mixtures of one or more alkoxides such as titanium ethoxide or titanium isopropoxide, one or more surfactants such as $HO(CH_2CH_2O)_n(CH_2CHCH_3O)_m(CH_2CH_2O)_nH$, (referred to herein as P123), hexadecyl trimethylammonium bromide (CTAB) or F127, one or more condensation inhibitors such as hydrochloric acid (HCl), water, and ethanol with molar ratios in the following ranges:

[Surfactant]/[alkoxide]: a molar ratio ranging from about $1 \times 10^{-7}$ to about 0.1

[Ethanol]/[alkoxide]: a molar ratio ranging from about 3 to about 20

[Condensation Inhibitor]/[alkoxide]: a molar ranging ratio from about $1.5 \times 10^{-5}$ to about 5.0

[water]/[alkoxide]: a molar ratio ranging from about 1 to about 20.

In one example, the alkoxide, surfactant, condensation inhibitor, water and ethanol may be mixed in molar ratios of about 1:0.1:1.4:17:20 respectively.

Incubation temperature, ramp rate and total incubation time may be varied to optimize the properties of the film. Under such conditions, the initial surfactant concentrations can be well below the critical micelle concentration (cmc), so the starting sols can have mesoscale homogeneity.

After incubation of the sol mixture, a substrate, e.g., the first electrode 402 (e.g., C- or Cu-coated steel foil sheet), is dipped in the mixture and removed e.g., using an automated, custom-built dip coating apparatus or a commercially available web coating system. Upon removal from the sol, preferential ethanol evaporation concentrates the sol in water, non-volatile surfactant, and the titanium isopropoxide component thereby forming the surfactant-templated porous film. By choosing the initial HCl acid concentration so as to impede the competing process of condensation (while not attacking the metal substrate), the progressively increasing concentration of surfactant drives the self-assembly of metal-alkoxide surfactant micelles and their further organization into liquid-crystalline mesophases.

The highly-ordered structure of the resulting liquid crystallites can be permanently fixed through exposure to heat. After pattern deposition and drying, the surfactant templates can be selectively removed by annealing the surfactant templated porous film at a temperature (~250° C.) that is sufficient to decompose the surfactant molecules while remaining within the thermal stability range of the underlying C- or Cu-coated steel foil substrate (<1000° C.). In particular, annealing is required to fix the titania-oxygen matrix. This processing step covalently cross-links the Titania molecules to one another and to the surface into a fixed matrix. The process requires an elevated temperature to drive the reaction in which the molecules are condensed into a cross-linked matrix with the loss of solvent or water. An annealing temperature of 250° C. is preferable as this temperature serves both to covalently cross-link the matrix and to pyrolyze the surfactant out of the matrix within a relatively short time. Once the sol has been cross-linked to itself and the substrate, any remaining surfactant is removed by soaking the substrate in ethanol or another appropriate solvent. Further, heating the surfactant templated porous film to may anneal the Titania film and promotes the crystalline, anatase phase of the Titania, leading to a material with high electron mobility. In one of many equivalent approaches, the film may be annealed at 450 C. for 30 minutes. Alternatively, the film may be annealed for a shorter time at a higher temperature or for a longer time at a lower temperature.

The annealing may occur before the deposition of any hole-accepting material such as polythiophene into porous film (step 306 discussed below), as it is this initial step that creates the porous structure. Thus the polymer to be deposited in a later step will not be affected by the annealing of the porous Titania film in this prior step.

For photovoltaic applications, it is desirable to create uniform films with regularly spaced pores having diameters of between about 1 nm and about 50 nm diameters, most preferably about 4 to 10 nm. The properties of the porous film 406, e.g., pore size and surface area, may be confirmed by $N_2$ gas adsorption isotherms. Such isotherms may be obtained, e.g., at −196° C. using a Beckman Coulter SA 3100 Surface Analyzer. Gas adsorption is considered an accurate method for determining surface area and pore size in the 2-200 nm range. In this measurement technique, inert gas molecules ($N_2$) are physisorbed onto the surface at a constant temperature, and the amount of gas adsorbed as a function of pressure is recorded as the adsorption isotherm. Monolayer formation on the sample by $N_2$ adsorbate occurs due to favorable adsorbate-adsorbent energies and enables BET (Brunauer, Emmett, Teller) surface area calculation. Multilayer formation occurs preferentially in the pores as a result of capillary adsorbate-adsorbate condensation and enables pore volume/size determination prior to bulk adsorbate-adsorbate interaction and condensation.

Figure 7:
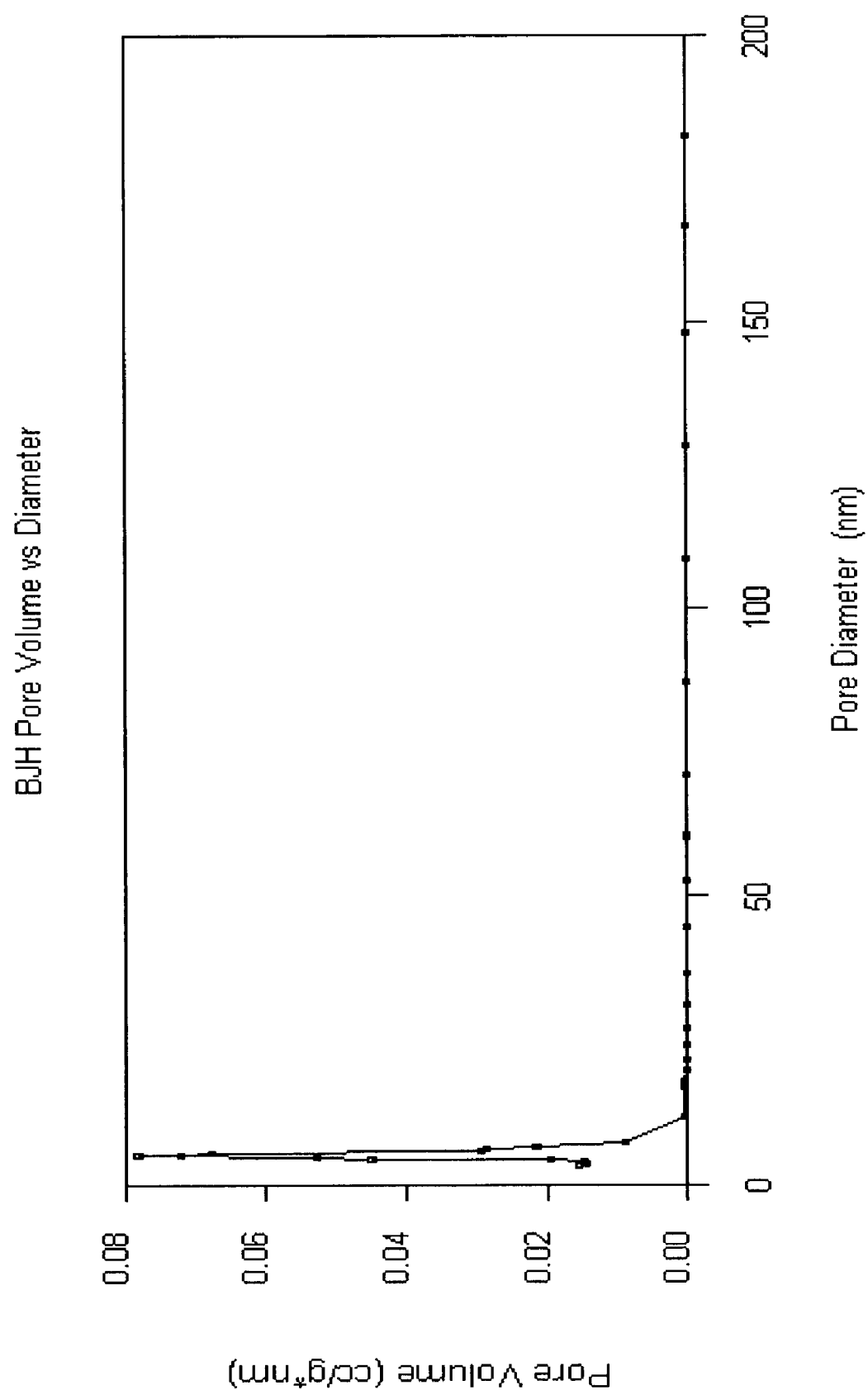
FIG. 7 depicts a graph of pore area vs. pore diameter for F127 templated polysiloxane porous film.

FIG. 7 shows data depicting the distribution of pore sizes in porous films created using the protocol described above. The graph in FIG. 7 plots pore area vs. pore diameter for a F127 templated polysiloxane porous film. Solutions containing F127 surfactant and polysiloxane were dropcast, dried, and annealed at 400° C. for two hours. A porous matrix covering a lateral surface area of 78.5 $cm^2$ was scraped off and placed in a sample chamber for surface analysis. Data was acquired using a Beckman Coulter SA 3100 surface analyzer using liquid nitrogen; samples were analyzed using the BET and BJH algorithms. A narrow distribution of pore sizes clustered around 6 nm shows that the pore structure is relatively uniform within the film, and that this structure can be successfully measured using $N_2$ adsorption isotherms.

Figure 8:
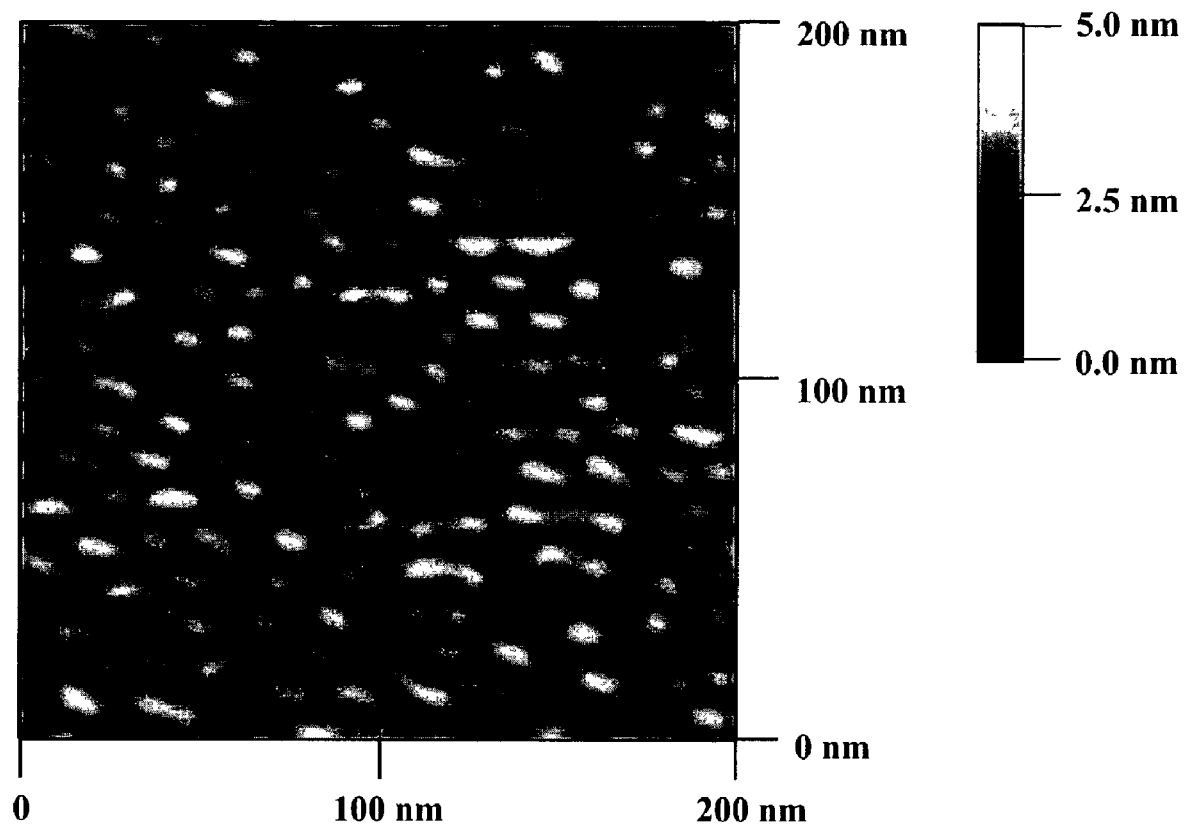
FIG. 8 depicts an atomic force micrograph of an example of a P123 surfactant-templated porous film suitable for use with embodiments of the present invention.

Alternatively, Atomic Force Microcopy (AFM) can be used to directly measure the sizes, orientations, and distributions of the pores in the porous film 306, and to monitor the two-dimensional orientation of both inorganic and organic crystals, to characterize the surface roughness data of all films including the scratches and other defects. FIG. 8 depicts an atomic force micrograph of an example of a surfactant-templated porous film manufactured using techniques of the type described above. In this particular example, a porous film of Titania was formed on a $F:SnO_2$ coated glass substrate using a sol mixture containing titanium ethoxide (an alkoxide), Pluronic P123 as a surfactant (available from BASF of Ludwigshafen, Germany), HCl as a condensation inhibitor, water and ethanol Alternatively, titanium tetraisopropoxide may be used as the alkoxide and/or indium tin oxide (ITO) coated glass may be used as the substrate. The initial sol mixture was prepared by refluxing titanium ethoxide, ethanol, water and an acid, such as HCl, at approximately 60° C.

The molar ratios of the P123 surfactant, HCl, ethanol and water may be in the following ranges with respect to titanium in the alkoxide:

[P123]/[Ti] a molar ratio ranging from about $1 \times 10^{-7}$ to about $1 \times 10^{-5}$

[Ethanol]/[Ti] a molar ratio ranging from about 10 to about 20

[HCl]/[Ti] a molar ratio ranging from about 0.5 to about 5

[$H_2O$]/[Ti] a molar ratio ranging from about 1 to about 10

The sol was cooled to room temperature and the surfactant p123 was added in amounts ranging from 0.6 g to 1.2 g. The polymer, polypropylene oxide (PPO), was also added in amounts ranging from approximately 0 g to 1.2 g, were added to 5 mL of the sol, along with 0.8 mL of 1N HCl. The sol was filtered and a thin film was prepared from this solution by dip-coating onto the glass substrate. Prior to dip-coating, the substrate was cleaned by sequential washing in (i) acetone, then (ii) methanol, then (iii) isopropyl alcohol (IPA). During the coating procedure, evaporation of the solvent caused the formation of surfactant-stabilized polypropylene microemulsions incorporated into a surfactant-templated Titania material. The as-coated films were heated to approximately 400 to 450° C. for approximately 3 hours to remove the surfactant and polypropylene oxide templates. During part of this phase, the temperature was ramped up at between about 0.5° C./min and about 5° C./min from room temperature up to about 400° C. The resulting surfactant-templated film has pores about 9 nm to 13 nm in diameter, with the pores spaced about 10 nm to 17 nm apart.

B. Filling the Pores in the Porous Film

As described above with respect to step 306, after construction of the surfactanttemplated porous film 406, e.g., composed of electron-accepting Titania, the pores 407 within the porous film 406 are substantially filled with a pore-filling material 408 such as polythiophene or any of the other materials described above with respect to pore-filling material 208. In this manner, a nanometer-scale charge-splitting network layer 405 can be formed to efficiently harvest excitons within the solar cell.

As used herein, the term "substantially filled" generally means that the pore-filling material 408 fills a significant volume of a sufficient percentage of the pores 407. It is often desirable to completely fill at least some of the pores 407 with the pore-filling material 408. In general, the larger the percentage of completely filled pores the better the performance of the resulting photovoltaic cell device. In particular, porous thin films with pores ranging from 4-10 m in diameter may be filled with a semiconducting, pore-filling material 408 such as the polymer poly 3-hexylthiophene (P3HT). P3HT is soluble in common organic solvents, and is an optically absorbent material between 400 and 700 nm, with a high hole mobility.

One approach to filling the pores 407 of the porous film 406 uses polymer in solution and an infiltration temperature of about 200° C. for about 30 minutes. Experiments in which porous Titania films have had their pores filled show that it is possible for polymer material to enter into a pore and to fill the majority (>80%) of the pore volume. Should it be difficult for the pore volume to be entirely filled, the charge separation can still function within the resulting photovoltaic cell. In the majority of areas where the pores are filled, the charge splitting network layer 405 will have a very high interfacial surface area for highly efficient exciton splitting, while for the incompletely filled pores, the device will nevertheless still function as a single-layer optoelectronic or photovoltaic device. In both circumstances, excitons can be split, and the device can produce electric power. By maximizing the number of pores that are filled, the exciton harvesting efficiency may also be maximized.

Pore filling and pore composition may be tested with absorption measurements and XPS depth profiling. XPS involves irradiating a solid in vacuum with mono-energetic soft X-rays and analyzing the energy of electrons emitted as a result. The electron energy spectrum may be obtained as a plot of the number of detected electrons per energy interval versus their binding energy. Each element has a unique spectrum, and so the spectrum from a mixture of elements is approximately the sum of the peaks of the individual constituents. Since the mean free path of electrons in solids is very short, the electrons detected by XPS mostly originate from only the top few atomic layers, making XPS a surface-sensitive technique.

There are alternatives to filling the pores 407 in the porous layer 406 with a polymer as the pore-filling material 408. For example, the pores 407 may be filled with a conducting, hole-accepting monomer material, which may be polymerized after monomer deposition within the pores 407. Furthermore, the pores 407 may be filled with an inorganic hole-accepting material such as Copper Oxide or other metal oxides, e.g., using electrodeposition. In this approach, it is possible to leverage the interconnected nature of the porous network of the porous film 406, which, if it reaches the underlying substrate electrode 402, or non-porous layer 404, can be used to deposit metal ions within the pores 407. Furthermore, it is also possible to electrodeposit a variety of metals (including Pt, Cu, and Al) into the pores of porous films on ITO- or $SnO_2$-coated glass, Mylar, and a variety of other plastic substrates.

C. Coating of Filled Porous Film With Conducting Polymer

As described in optional step 308, after the pores 407 in the porous film 406 have been filled with hole-accepting pre-filling material 408, the filled porous film 406 may then be coated with a layer of hole-accepting material 409. The layer of hole-accepting material 409 coats the charge splitting network layer 405. Any suitable coating technique may be used, e.g., dip coating, web coating, spin coating, spray coating, and the like. By way of example, the layer of hole-accepting material 409 may be made from a solution containing the same material 408 just used to fill the pores 407. For example, the pore-filling material 408 and the layer of hole-accepting material 409 may both be made from a polymeric conductor, such as P3HT. Alternatively, the pore-filling material 408 and layer of hole-accepting material 409 may be made from different materials. Measurement of uniform surface features by high-magnification optical microscopy may serve as a quality control check for this task.

To make a workable photovoltaic device, it is desirable to electrically contact the hole accepting material 408 to an electrode, e.g. via the layer of hole-accepting material 409. As shown in FIGS. 4A-4F, it is possible to make such contact by building a photovoltaic cell device of the type shown in FIG. 2 in two sections and then joining the two sections together. Up to this point in the construction process (step 308 in FIG. 3), the first section 401 a photovoltaic cell device has been built. In an alternative example of steps 310 and 312, which are described in detail below, the second section 415 is built and the two sections are joined together to form a completed device of the type shown in FIG. 2.

D. Coating of Thin Aluminum Foil Electrode With Semiconducting Polymer

By way of example the hole accepting electrode 410 may be made from a foil comprised of C- or Cu-coated steel foil, which can also provide for mechanical strength. The foil can be coated with a solution containing the same polymeric semiconductor (such as P3HT) used both to fill the pores 407 and to coat the filled charge-splitting and transporting network layer 405. Again, any suitable coating process may be used, e.g., dip coating, web coating, spin coating, spray coating and the like. Lamination may also occur within the interface layers 403, 413 or any other layer as long as a multilayer structure of the type depicted in FIG. 4E results.

E. Lamination of device sections

As shown in FIG. 4E, the first and second sections 401, 415 of a photovoltaic cell device may be attached to each other by lamination at the homo-junction (indicated by the dashed line) between the conducting polymer material coating the hole-accepting electrode 410 and the same polymer material coating the charge-splitting network layer 405. Upon lamination, a complete photovoltaic device structure will have been constructed.

IV. ALTERNATIVE EMBODIMENTS

A. Solar Power Generation Systems

Figure 9A:
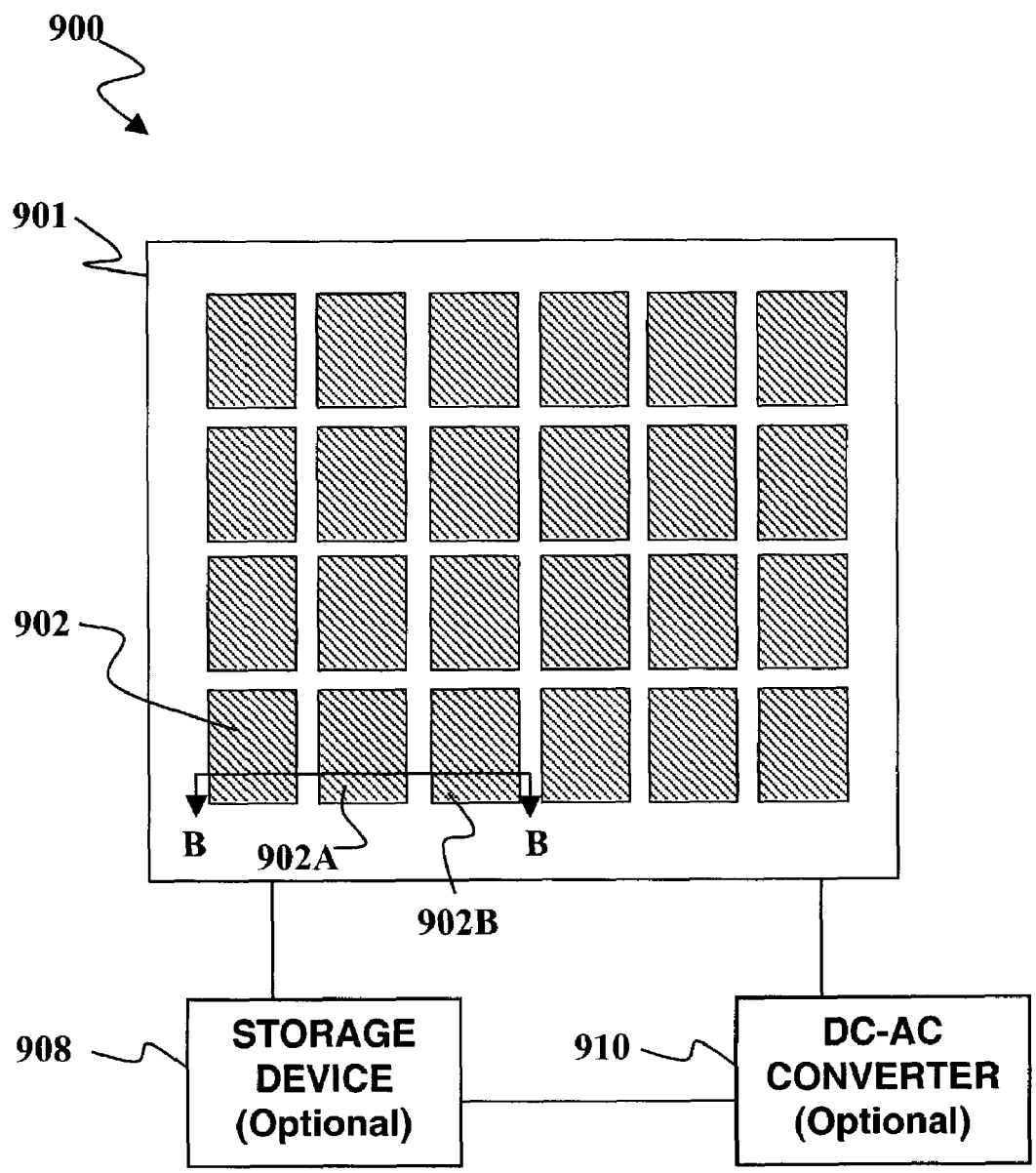
FIG. 9A depicts a plan view schematic diagram of a solar power generation system according to an embodiment of the present invention.
Figure 9B:
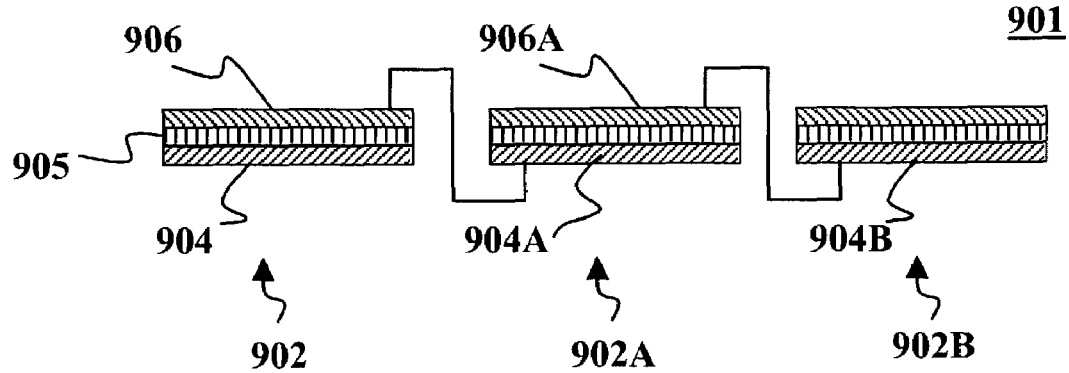
FIG. 9B depicts a side-view cross-sectional schematic diagram of a portion of the solar power generation of FIG. 9A taken along line B-B.

Other embodiments of the present invention may be directed to solar power generation systems that utilize photovoltaic cells that incorporate charge-splitting networks of the types described above. An example of such a power generation system 900 is depicted in FIGS. 9A-9B. The power system 900 generally comprises an array 901 of photovoltaic cells 902 having features in common with those described above with respect to FIGS. 2 and 4A-4F. In particular, one or more of the cells 902 in the array 901 includes one or more charge-splitting networks 905 disposed between an electron-accepting electrode 904 and a hole-accepting electrode 906. Each charge splitting network 905 includes a porous film having uniformly distributed nanometer-scale pores that are filled with a pore-filling material. The porous film and the pore-filling material have complementary charge-accepting properties with respect to each other, i.e., one material acts an electron-acceptor with respect to the other material, which acts as a hole-acceptor. The electron-acceptor would be in electrical contact with the electron-acceptor electrode 904 and the hole-acceptor material would be in electrical contact with the hole-acceptor electrode 906. An interaction between radiation and the charge-splitting network 905 generates an electrical voltage between the electron-accepting electrode 904 and the hole-accepting electrode 906. By way of example, and without loss of generality, the porous film may be an electron-accepting Titania-based surfactant templated film and the pore filling material may be a suitable hole-accepting material.

To obtain higher aggregate voltages, two or more cells, e.g., cells 902, or groups of cells, may be electrically connected in series. For example, as shown in FIG. 9B, cells 902, 902A, and 902B are connected in series, with the hole-accepting electrode 906 of cell 902 connected to the electron-accepting electrode 904A of cell 902A and the hole accepting electrode 906A of cell 902A connected to the electron-accepting electrode 904B of cell 902B. There are many commercial solutions to interconnect of solar cells, many of which can be applied to the device structure. For example, standard scribing/etching techniques as used by many thin-film manufacturers can be used. For instance, either the electron-accepting electrode or the hole-accepting electrode may be separated by laser grooving, mechanical separation (mechanical grooving), or a separating line (e.g., ~0.5 mm wide) can be etched across a large area photovoltaic web using a macroscopic screen (no photolithography is required). Once the cells 902 are divided from one another, they can be interconnected in series by overlapping the transparent electrodes (which can be similarly divided) with the bottom layer.

Organic solar cells typically generate higher voltages than most inorganic cell structures, resulting in individual cell voltages between 0.7 and 1.3 V, and thus these cells require fewer interconnects to obtain the higher aggregate voltages as desired in many applications. Conventional cells tend to generate only about 0.5 to 0.8V per cell; and, further, silicon-based cells are restricted to the common silicon wafer sizes so that they need to connect many cells in parallel to obtain high currents by covering a larger surface area.

The system may optionally include an energy storage device 908 connected to the array 901. By way of example, the energy storage system may be in the form of one or more batteries or one or more electrolytic cells for producing hydrogen form water using electricity generated by the cells 902 in the array 901. Alternatively, the cells 902 may be configured to generate hydrogen from water directly using a radiation-driven electrolytic reaction. The storage device 908 may include a storage tank for holding the hydrogen and/or a fuel cell for converting the energy stored in the hydrogen back to electric power on demand.

The system 900 may be scaled as a stand-alone for a commercial or residential facility. Alternatively, the system may include an optional DC-AC converter 910 so that electric power produced by the system 900 may be distributed over a conventional electric power grid. Because of the improved efficiency and lower manufacturing cost of photovoltaic cells of the type described herein the system 900 is potentially capable of producing electric power at a cost per kilowatt hour (kwh) competitive with conventional electric grid rates.

B. Alternative Approaches to Porous Nano-Architected Films

Although the above description describes formation of porous nano-architected by a particular templated growth technique that uses surfactants as a structuring agent, the present invention is not limited to this technique alone. Porous nano-architected films for charge-splitting networks or optoelectronic devices may alternatively be fabricated by such approaches as: (a) Intercalation and/or grafting of organic or polymeric molecules within a mineral lamellar network; (b) Synthesis by electrocrystallisation of hybrid molecular assemblies; (c) Impregnation of preformed inorganic gels; (d) Synthesis from heterofunctional metallic alkoxides or silsesquioxannes; (e) Synthesis of hybrid through the connection of well defined functional nanobuilding blocks; and (f) templated growth of inorganic or hybrid networks by using organic molecules and macromolecules other than surfactants, e.g., amines, alkyl ammonium ions, amphiphilic molecules, as structure directing agents. Suitable adjustment of the result effective parameters in these techniques may produce a nano-architected film having interconnected pores that are distributed in a substantially uniform fashion with neighboring pores separated by a distance of between about 1 nm and about 100 nm, wherein the pores have diameters of between about 1 nm and about 100 nm. The interconnected pores may be accessible from an underlying layer and/or overlying layer (if any). The pores in a porous nano-architected produced by any of these techniques may be filled with a pore-filling material having complementary charge transfer properties as described above.

V. CONCLUSION

Embodiments of the present invention provide a novel and useful optoelectronic devices, such as photovoltaic cell devices for use in electric power production as well as methods for the manufacture of such materials and power systems using such devices. The charge-splitting networks and photovoltaic cells described herein are potentially less expensive to manufacture than conventional charge-splitting networks, optoelectronic devices and photovoltaic cells. It is to be understood that the above description is intended to be illustrative and not restrictive. Many embodiments and variations of the invention will become apparent to those of skill in the art upon review of this disclosure. Merely by way of example a wide variety of process times, reaction temperatures and other reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

What is claimed is:

1. An optoelectronic device, comprising:
   a porous film comprising an inorganic material and having interconnected pores that are distributed in a substantially uniform fashion with neighboring pores; and
   a pore-filling material that substantially fills the pores in the porous film,
   wherein the porous film and the pore-filling material have complementary charge-transfer properties with respect to each other to provide a charge-splitting network;
   wherein the interconnected pores in the porous film are accessible from an underlying layer and/or overlying layer;
   wherein the porous film has sufficient structural integrity to be stable and define the pores, independent of any pore-filling material in the pores of the film.

2. The device of claim 1 wherein the porous film is an electron-acceptor and the pore-filling material is a hole-acceptor.

3. The device of claim 2 wherein the porous film includes a material selected from the group consisting of titania ($TiO_2$), zinc oxide ($ZnO_2$), zirconium oxide, lanthanum oxide, niobium oxide, tungsten oxide, strontium oxide, calcium/titanium oxide, sodium titanate and potassium niobate.

4. The device of claim 1 wherein the pore-filling material includes a material selected from the group consisting of poly(phenylene) and derivatives thereof, poly(phenylene vinylene) and derivatives thereof, poly(2-methoxy-5-(2-ethyl-hexyloxy)-1,4-phenylene vinylene (MEH-PPV), poly (para-phenylene vinylene) (PPV) poly(thiophene) and derivatives thereof (poly(3-octylthiophene-2,5, -diyl) regioregular, poly(3-octylthiophene-2,5, -diyl) regiorandom, poly (3-hexylthiophene-2,5-diyl) regioregular, poly(3-hexylthiophene-2,5-diyl) regiorandom, poly(thienylenevinylene) and derivatives thereof, poly(isothianaphthene) and derivatives thereof, organometallic polymers, polymers containing perylene units, and poly(squaraines) and their derivatives.

5. The device of claim 1 wherein the pore-filling material includes a material selected from the group consisting of organic pigments or dyes, azo-dyes having azo chromofores (—N=N—) linking aromatic groups, phthalocyanines including metal-free phthalocyanine (HPc), perylenes, naphthalocyanines, squaraines, merocyanines and their respective derivatives, poly(silanes), poly(germinates), 2,9-di (pent-3-yl)-anthra[2,1,9-def:6,5,10-d'e'f']diisoquinoline-1,3, 8,10-tetrone, and 2,9-bis-(1-hexyl-hept-1-yl)-anthra[2,1,9-def:6,5,10-d'e'f']diisoquinoline-1,3,8,10-tetrone.

6. The device of claim 1 wherein the pore-filling material includes an inorganic material.

7. The device of claim 6 wherein the inorganic material includes copper oxide or another metal oxide.

8. The device of claim 1 wherein the pore-filling material includes a combination of two or more compounds.

9. The device of claim 8 wherein the pore-filling includes buckminsterfullerene ($C_{60}$) and a polythiophene derivative.

10. The device of claim 1 further comprising an electrically conducting substrate in electrical contact with the porous film.

11. The device of claim 10 further comprising a charge-transport film disposed between the substrate and the porous film.

12. The device of claim 11 wherein the charge-transport film includes a material selected from the group consisting of titania ($TiO_2$), zinc oxide ($ZnO_2$), zirconium oxide, lanthanum oxide, niobium oxide, tungsten oxide, strontium oxide, calcium/titanium oxide, sodium titanate and potassium niobate.

13. The device of claim 12 further comprising a transparent electrode in electrical contact with the pore-filling material.

14. The device of claim 13 further comprising a hole-accepting material disposed between the charge-transport film and the transparent electrode.

15. The device of claim 14 further comprising one or more encapsulant layers.

16. A solar power generation system, comprising:
   an array of photovoltaic cells, wherein one or more cells in the array includes one or more porous nano-architected charge-splitting networks disposed between a first electrode and a second electrode;
   wherein each of the porous charge-splitting networks comprises:
   a porous film comprising an inorganic material and having interconnected pores that are distributed in a substantially uniform fashion with neighboring pores separated by a distance of between about 1 nm and about 100 nm, wherein the pores are accessible from an underlying layer and/or overlying layer; and
   a pore-filling material that substantially fills the pores in the porous film,
   wherein the porous film and the pore-filling material have complementary charge transfer properties with respect to each other to provide a charge-splitting network;
   wherein the porous film has sufficient structural integrity to be stable and define the pores, independent of any pore-filling material in the pores of the film.

17. The system of claim 16, wherein two or more of the cells in the array are electrically connected to each other in series.

18. The system of claim 16 wherein the porous film is an electron-acceptor and the pore-filling material is a hole-acceptor.

19. The system of claim 18 wherein the porous film includes a material from selected the group consisting of titania ($TiO_2$), zinc oxide ($ZnO_2$), zirconium oxide, lanthanum oxide, niobium oxide, tungsten oxide, strontium oxide, calcium/titanium oxide, sodium titanate and potassium niobate.

20. The system of claim 16 wherein the pore-filling material includes at least one material selected from the group consisting of poly(phenylene) and derivatives thereof, poly(phenylene vinylene) and derivatives thereof, [(]poly(2-methoxy-5-(2-ethyl-hexyloxy)-1,4-phenylene vinylene (MEH-PPV), poly(para-phenylene vinylene) (PPV), poly(thiophene) and derivatives thereof poly(3-octylthiophene-2,5,-diyl) regioregular, poly(3-octylthiophene-2,5,-diyl) regiorandom, poly(3-hexylthiophene-2,5-diyl) regioregular, poly(3-hexylthiophene-2,5-diyl) regiorandom, poly(thienylenevinylene) and derivatives thereof, poly(isothianaphthene) and derivatives thereof, organometallic polymers, polymers containing perylene units, and poly(squaraines) and their derivatives.

21. The system of claim 16 wherein the pore-filling material includes at least one material selected from the group consisting of organic pigments or dyes, azo-dyes having azo chromofores (—N═N—) linking aromatic groups, phthalocyanines including metal-free phthalocyanine (HPc), perylenes, naphthalocyanines, squaraines, merocyanines and their respective derivatives, poly(silanes), poly(germinates),2,9-di(pent-3-yl)-anthra[2,1,9-def:6,5,10-d'e'f']diisoquinoline-1,3,8,10-tetrone, and 2,9-bis-(1-hexyl-hept-1-yl)-anthra [2,1,9-def:6,5,10-d'e'f']diisoquinoline-1,3,8,10-tetrone.

22. The system of claim 16 wherein the pore-filling material includes an inorganic material.

23. The system of claim 22 wherein the inorganic material includes copper oxide or another metal oxide.

24. The system of claim 16 wherein the pore-filling material includes a combination of two or more compounds.

25. The system of claim 24 wherein the pore-filling includes buckminsterfullerene ($C_{60}$) and a polythiophene derivative.

26. The system of claim 16 further comprising an electrically conducting substrate in electrical contact with the porous film.

27. The system of claim 26 further comprising a charge-transport film disposed between the substrate and the porous film.

28. The system of claim 27 wherein the charge-transport film includes at least one material selected from the group consisting of titania ($TiO_2$), zinc oxide ($ZnO_2$), zirconium oxide, lanthanum oxide, niobium oxide, tungsten oxide, strontium oxide, calciumltitanium oxide, sodium titanate and potassium niobate.

29. The system of claim 28 further comprising a transparent electrode in electrical contact with the pore-filling material.

30. The system of claim 29 further comprising a hole-accepting material disposed between the charge-transport film and the transparent electrode.

31. The system of claim 30 further comprising one or more encapsulant layers.

32. The system of claim 16 where the porous film comprises a surfactant-templated porous film.

* * * * *